United States Patent
Imai et al.

(10) Patent No.: US 9,545,848 B2
(45) Date of Patent: Jan. 17, 2017

(54) POWER CONVERTER FOR ELECTRIC VEHICLE

(71) Applicants: Yohei Imai, Aichi-gun (JP); Takashi Hamatani, Toyota (JP); Kunihiro Iwata, Ichinomiya (JP)

(72) Inventors: Yohei Imai, Aichi-gun (JP); Takashi Hamatani, Toyota (JP); Kunihiro Iwata, Ichinomiya (JP)

(73) Assignees: TOYOTA JIDOSHA KABUSHIKI KAISHA, Toyota (JP); TOYODA IRON WORKS CO., LTD., Toyota (JP)

( * ) Notice: Subject to any disclaimer, the term of this patent is extended or adjusted under 35 U.S.C. 154(b) by 569 days.

(21) Appl. No.: 14/048,595

(22) Filed: Oct. 8, 2013

(65) Prior Publication Data

US 2014/0111003 A1    Apr. 24, 2014

(30) Foreign Application Priority Data

Oct. 22, 2012    (JP) .................. 2012-233175

(51) Int. Cl.
*H02G 3/00* (2006.01)
*B60L 3/00* (2006.01)
(Continued)

(52) U.S. Cl.
CPC ............. *B60L 3/0084* (2013.01); *B60L 11/14* (2013.01); *B60L 15/007* (2013.01); *B60R 16/02* (2013.01); *H02M 7/003* (2013.01); *H05K 5/064* (2013.01); *H05K 7/2039* (2013.01); *B60L 2210/12* (2013.01); *B60L 2210/14* (2013.01); *B60L 2210/30* (2013.01); *B60L 2210/40* (2013.01); *B60L 2240/36* (2013.01); *Y02T 10/645* (2013.01); *Y02T 10/70* (2013.01); *Y02T 10/7077* (2013.01); *Y02T 10/7225* (2013.01); *Y02T 10/7233* (2013.01); *Y02T 10/7241* (2013.01)

(58) Field of Classification Search
CPC ....... H05K 5/064; H05K 7/2039; B60R 16/02; Y02K 10/7077; Y02K 10/7233; Y02K 10/7225; Y02K 10/645; Y02K 10/70; B06L 11/14; B06L 15/007; B06L 2210/12; B06L 2210/14; B06L 2210/30; B06L 2210/40; B06L 2240/36
USPC ....... 307/10.1; 361/752, 820, 699, 707, 714, 361/715, 807; 174/260, 546, 531
See application file for complete search history.

(56) References Cited

U.S. PATENT DOCUMENTS 5,408,383 A * 4/1995 Nagasaka ........... H01L 21/4842
257/E23.066
7,969,735 B2 * 6/2011 Nakatsu ................ H02M 7/003
165/104.33
(Continued)

FOREIGN PATENT DOCUMENTS

CN   101636803 A   1/2010
JP   U-5-15334    2/1993
(Continued)

*Primary Examiner* — Arnold Kinkead

(57) ABSTRACT

A power converter includes a capacitor, a case, and a filler. The case houses the capacitor and includes a metal plate and a partition wall. The filler is interposed between the case and the capacitor. The metal plate is positioned between the capacitor and another electronic component, inside the power converter. Also, the partition wall separates the capacitor from the metal plate.

5 Claims, 5 Drawing Sheets

(51) Int. Cl.
*H05K 5/06* (2006.01)
*B60R 16/02* (2006.01)
*H05K 7/20* (2006.01)
*H02M 7/00* (2006.01)
*B60L 11/14* (2006.01)
*B60L 15/00* (2006.01)

(56) References Cited

U.S. PATENT DOCUMENTS

2010/0014252 A1 1/2010 Hamatani
2015/0342071 A1* 11/2015 Mijac .................. H05K 5/064
361/752

FOREIGN PATENT DOCUMENTS

| | | |
|---|---|---|
| JP | A-2005-108953 | 4/2005 |
| JP | A-2008-235441 | 10/2008 |
| JP | A-2009-206342 | 9/2009 |
| JP | A-2010-251399 | 11/2010 |
| JP | B2-4702311 | 6/2011 |

* cited by examiner

POWER CONVERTER FOR ELECTRIC VEHICLE

INCORPORATION BY REFERENCE

The disclosure of Japanese Patent Application No. 2012-233175 filed on Oct. 22, 2012 including the specification, drawings and abstract is incorporated herein by reference in its entirety.

BACKGROUND OF THE INVENTION

1. Field of the Invention

The invention relates to a power converter suitable for an electric vehicle. More particularly, the invention relates to a power converter such as a voltage converter or an inverter that handles current to be supplied to a running motor of an electric vehicle. The term "electric vehicle" in this specification includes a fuel cell vehicle and a hybrid vehicle provided with both an electric motor and an engine.

2. Description of Related Art

A power converter such as an inverter or a converter is provided with a capacitor for smoothing input current or output current. The capacitor is an element that tends to generate heat, and the current supplied to the running motor of the electric vehicle is several tens of amperes, so this kind of capacitor that smooths such current has a high capacity and also generates a large amount of heat. On the other hand, devices that are mounted in a vehicle must be compact. As a result of making the power converter smaller, the packaging density of the components increases, so it becomes important to not only cool the components, but also to reduce the effects of heat on other components. In particular, in addition to generating a large amount of heat itself, the capacitor itself is not very heat resistant, so it is important to protect the capacitor from the heat of other components.

Japanese Patent No. 4702311 and Japanese Patent Application Publication No. 2009-206342 (JP 2009-206342 A), for example, propose technology related to countermeasures against heat for capacitors. The technology described in Japanese Patent No. 4702311 protects a capacitor from heat generated by an inverter circuit or the like, by arranging a metal plate between the capacitor and an electronic component that generates heat. The metal plate reflects the heat generated by the electronic component. Also, the metal plate is fixed to a housing, so the heat absorbed by the metal plate is diffused to the housing. Thus, the metal plate protects the capacitor against heat. Further, in order to insulate the capacitor from surrounding components, the area around the capacitor is covered with resin. However, when the capacitor or an electrode provided extending from the capacitor contracts repeatedly due to repeated changes in temperature (a thermal cycle), repeated stress is applied to the resin, which may cause it to crack. Depending on the position and shape of the crack, current may flow from the capacitor to the metal plate through the crack, and as a result, insulation between the capacitor and other components may be unable to be ensured. JP 2009-206342 A proposes arranging a resin plate between the electrode and the filled resin to prevent the resin filled around the capacitor from cracking. The effects from expansion and contraction of the electrode are mitigated by this resin plate, so stress that acts on the filled resin is reduced.

SUMMARY OF THE INVENTION

When using a metal plate to protect the capacitor from heat, in many cases resin is filled between the capacitor and the metal plate to ensure that the capacitor is insulated. However, if a crack occurs in the filled resin, it becomes difficult to ensure the insulation of the capacitor. This specification thus provides a structure that uses a metal plate to protect a capacitor from the heat of another component, and in which insulation between the metal plate and the capacitor is not easily lost.

The power converter of the invention is mounted in an electric vehicle and converts electric power of a battery to electric power suitable for driving a running motor. The power converter includes a capacitor, a case, and a filler. The case houses the capacitor, and includes a metal plate and a partition wall. The filler is interposed between the case and the capacitor. The metal plate is positioned between the capacitor and another electronic component, inside the power converter. Also, the partition wall separates the capacitor from the metal plate.

According to this structure, even if a crack occurs in the filler, the crack is inhibited from progressing by the partition wall. Therefore, a crack extending between the metal plate and the filter capacitor is able to be inhibited from forming, so insulation of the capacitor is ensured.

BRIEF DESCRIPTION OF THE DRAWINGS

Features, advantages, and technical and industrial significance of exemplary embodiments of the invention will be described below with reference to the accompanying drawings, in which like numerals denote like elements, and wherein.

DETAILED DESCRIPTION OF EMBODIMENTS

A power converter according to one example embodiment of the invention will be described with reference to the drawings. The power converter of this example embodiment is a power control unit mounted in a hybrid vehicle. This power control unit includes a circuit that steps up power from a main battery, then converts it to alternating current, and outputs it to an electric motor, and a circuit that steps down the power from the main battery and supplies it to another electric device.

Figure 1:
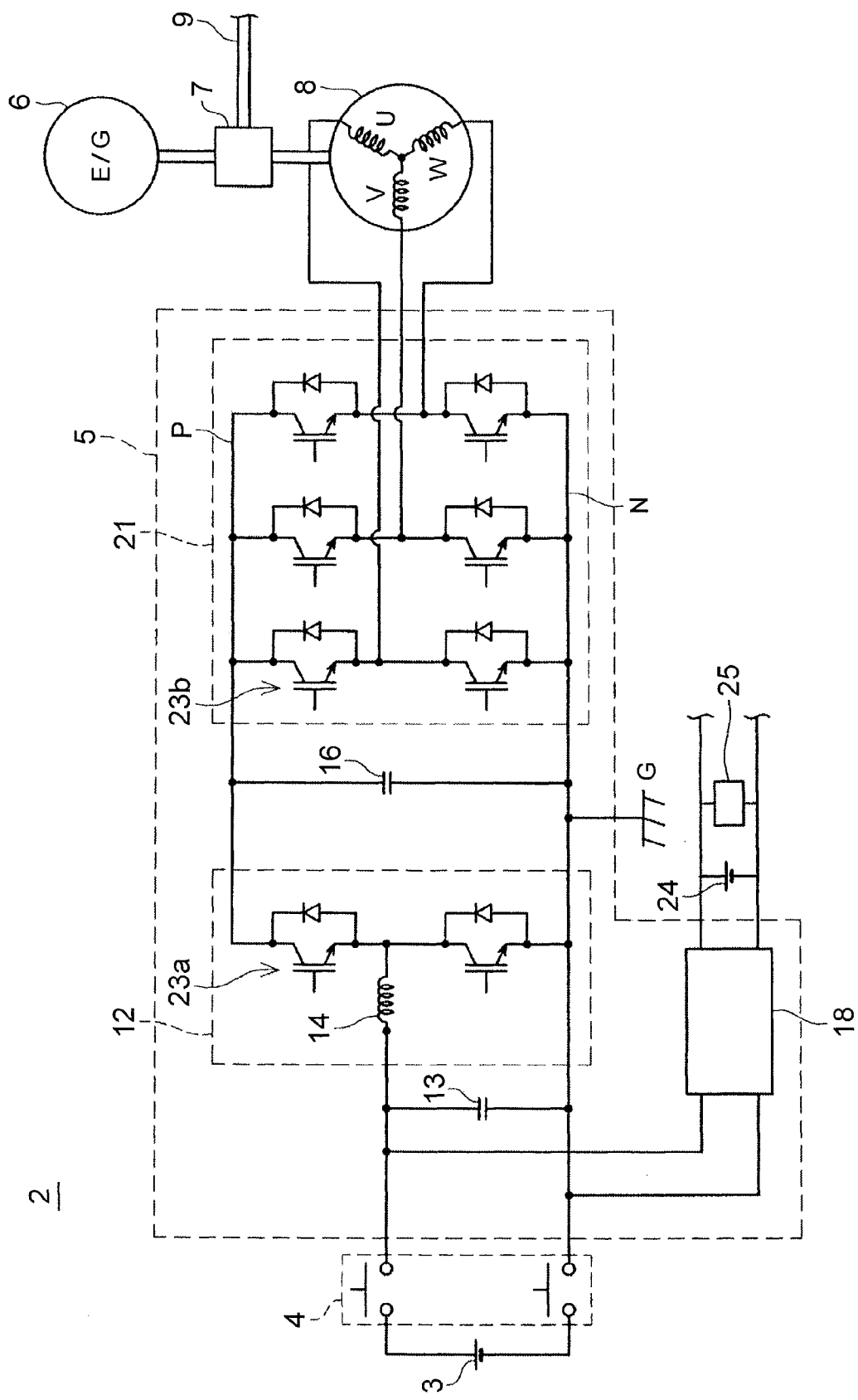
FIG. 1 is a block diagram of a power system of a hybrid vehicle that includes a power control unit according to one example embodiment of the invention.

Before describing the power control unit, an overview of the power, system of the hybrid vehicle will be given. FIG. 1 is a block diagram of the power system of a hybrid vehicle 2. This hybrid vehicle 2 is provided with an electric motor 8 and an engine 6 as driving power sources for running. Output torque of the electric motor 8 and output torque of the engine 6 are split and/or combined as appropriate by a power splitting mechanism 7, and then transmitted to an axle 9, i.e., a wheel. It should be noted that in FIG. 1, only parts necessary to describe the technology described in this specification are shown. Some of the parts not related to the description are not shown in the drawings.

Power for driving the electric motor 8 is supplied from a main battery 3. The output voltage of this main battery 3 is 300 volts, for example. Also, the hybrid vehicle 2 also includes an auxiliary battery 24 for supplying power to a group of devices driven by voltage lower than the output voltage of the main battery 3, such as a car navigation system and a room lamp and the like, in addition to the main battery 3. In FIG. 1, the group of devices driven by voltage lower than the output voltage of the main battery 3 will collectively be referred to as "accessories 25". A signal processing circuit, except for a high-current system circuit of a power control unit 5, is also one type of accessory. One example of a signal processing circuit is a PWM forming circuit. Also, the term "main battery" is simply used for convenience to differentiate it from the "auxiliary battery". Hereinafter, to simplify the description, the power control unit 5 may be referred to as "PCU 5".

The main battery 3 is connected to the PCU 5 via a system main relay 4. This main relay 4 is a switch that connects and disconnects the main battery 3 to and from the drive system of the vehicle. The main relay 4 is switched by a host controller, not shown.

The PCU 5 is an electronic circuit that is connected between the main battery 3 and the electric motor 8. The PCU 5 includes a first converter circuit 12 that steps up the voltage of the main battery 3 to a voltage suitable for driving the electric motor 8 (such as 600 volts, for example), an inverter circuit 21 that converts direct current power after the voltage is stepped up to alternating current, and a second converter circuit 18 that steps down the power of the main battery 3 to a voltage suitable for driving the accessories 25 (such as 12 volts, for example).

The hybrid vehicle 2 is also able to generate power with the electric motor 8 using the driving force of the engine 6 or deceleration energy of the vehicle. When the electric motor 8 generates power, the inverter circuit 21 converts alternating current to direct current, and then the first converter circuit 12 steps the voltage down to a voltage that is just slightly higher than the voltage of the main battery 3, and supplies it to the main battery 3.

The first converter circuit 12 is a circuit that mainly includes a filter capacitor 13, a reactor 14, and two switching circuits 23a. Each of the switching circuits 23a is formed by an inverse-parallel connection of an IGBT and a diode. More specifically, the structure of the first converter circuit 12 is as described below. The reactor 14 and the filter capacitor 13 are connected in series, and the junction point of the two corresponds to input of the first converter circuit 12. The other end of the filter capacitor 13 is connected to a ground. The other end of the reactor 14 is connected to the junction point of the two switching circuits that are connected together in series. This kind of circuit configuration is well known as a step up/down converter. The filter capacitor 13 is provided to smooth the input current supplied from the main battery 3.

The inverter circuit 21 is a circuit that mainly includes six switching circuits 23b that repeatedly switch to create an alternating current of U-, V-, and W-phases of the electric motor 8. Each of the switching circuits 23b is formed by inverse-parallel connection of an IGBT and a diode.

The IGBTs and the diodes that form the switching circuits 23a of the first converter circuit 12 and the switching circuits 23b of the inverter circuit 21, and the circuits therearound, are packaged as an intelligent power module (IPM). In this specification, a description of this kind of packaging will be omitted. Also, it should be noted that in the drawings, reference characters for a plurality of switching circuits that are similar are omitted.

Smoothing capacitors 16 are connected in parallel on a high voltage side (i.e., the inverter circuit side) of the first converter circuit 12. The smoothing capacitors 16 are inserted for smoothing the current that is input to the inverter circuit 21. An electric wire on the high potential side of the switching circuits 23a of the first converter circuit 12 and the high potential side of the switching circuits 23b of the inverter circuit 21 will be referred to as a P wire. In contrast, an electric wire on the low potential side of the first converter circuit 12 and the inverter circuit 21 will be referred to as an N wire. The N wire is connected to a ground G. A large current is supplied from the main battery 3 to the electric motor 8, so the filter capacitor 13 and the reactor 14 through which this large current flows generate a particularly large amount of heat.

In the PCU 5, the second converter circuit 18 that steps down the voltage of the main battery 3 is also connected to the main battery 3 via the main relay 4. As shown in FIG. 1, the second converter circuit 18 supplies power to the accessories 25, and charges the auxiliary battery 24. The auxiliary battery 24 is provided for supplying power to the accessories 25 when power is not supplied from the main battery 3. For example, when the main relay 4 is open, power stored in the auxiliary battery 24 is supplied to the accessories 25.

Figure 2:
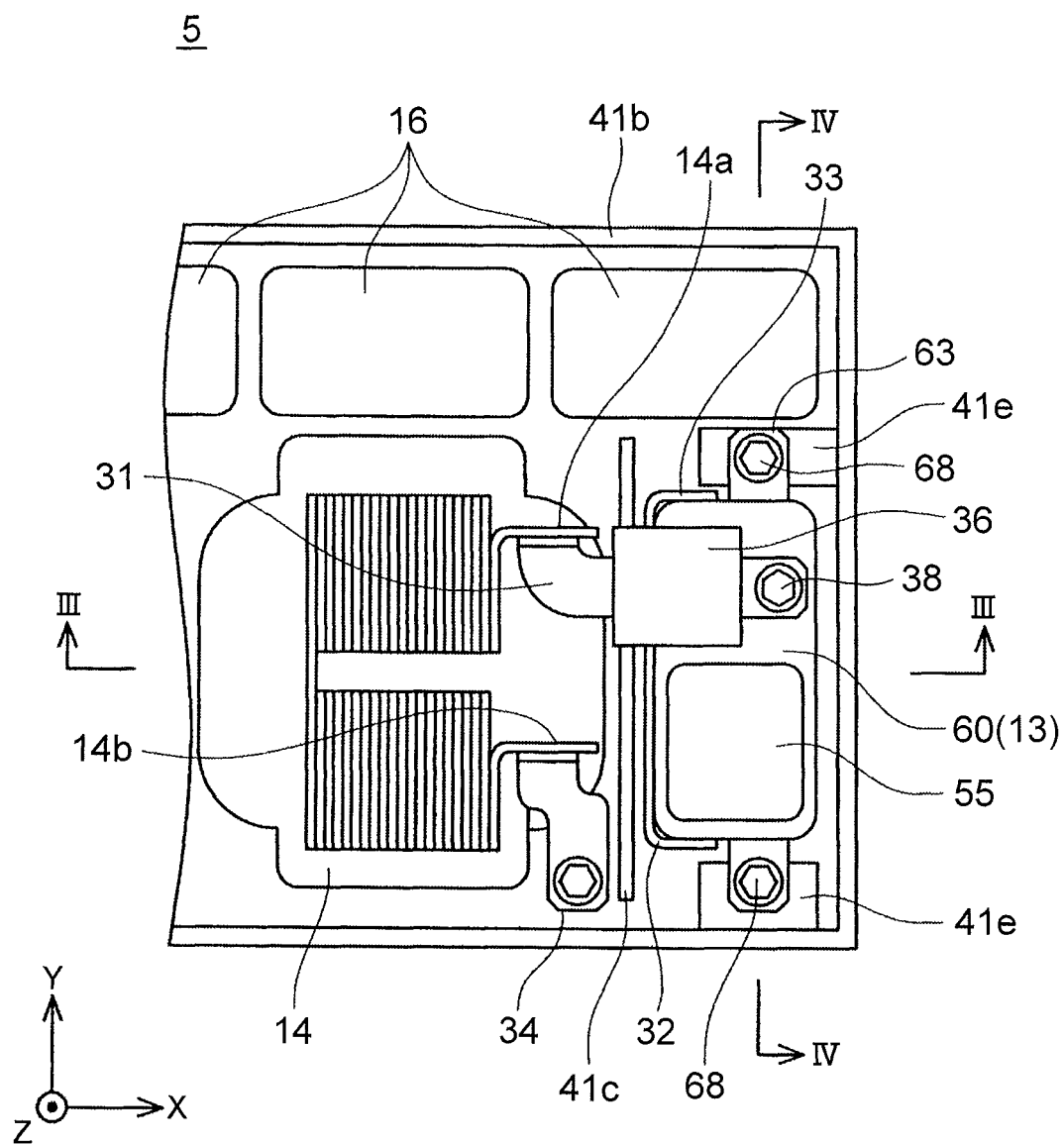
FIG. 2 is a plan view of (a portion of) the power control unit.
Figure 3:
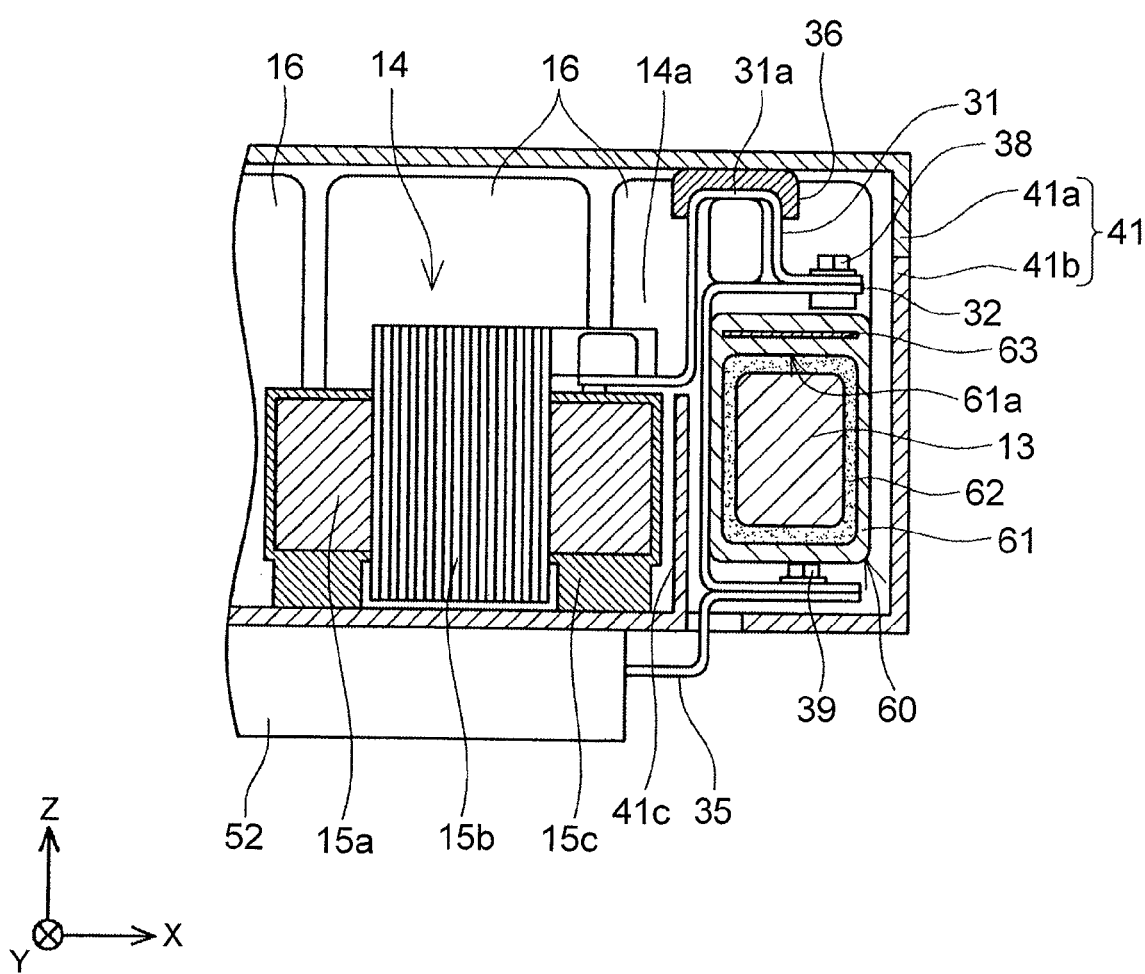
FIG. 3 is a sectional view corresponding to arrow III-III in FIG. 2.
Figure 4:
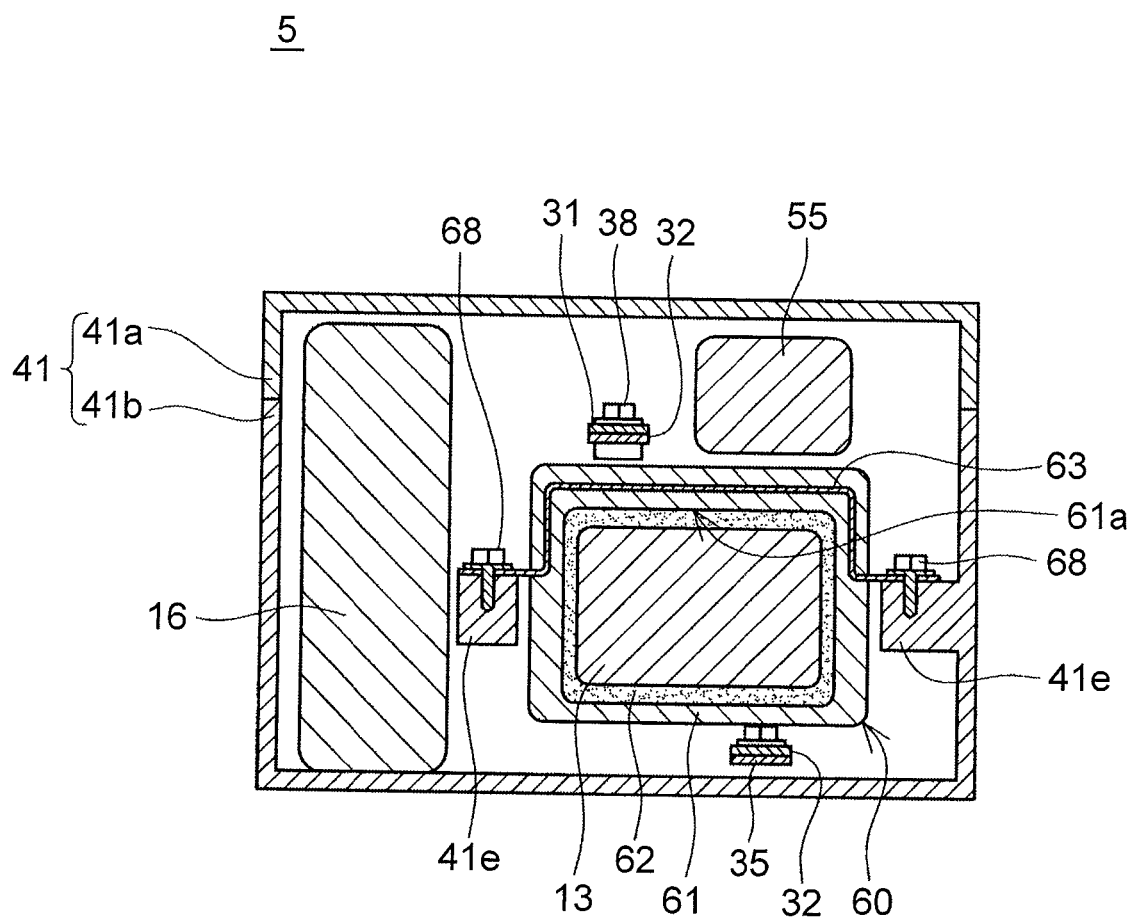
FIG. 4 is a sectional view corresponding to arrow IV-IV in FIG. 2.

Next, the hardware structure of the PCU 5 will be described. FIG. 2 is a plan view of a portion of the PCU 5. More particularly, FIG. 2 is a view showing portions related to the reactor 14 and the filter capacitor 13. FIG. 3 is a sectional view corresponding to arrow III-III in FIG. 2, and FIG. 4 is a sectional view corresponding to arrow IV-IV in FIG. 2. However, it should be noted that some of the hardware, such as the IGBTs that form the switching circuits 23b and the IPMs in the diodes, are not shown in FIGS. 2 to 4. Also, the inside of a second converter unit 52 is not shown in FIG. 3. The second converter unit 52 is a housing within which the second converter circuit 18 described above is housed.

In this example embodiment, a Z positive direction will be up, a Z negative direction will be down, and Y and X directions will be horizontal. A case 41 of the PCU 5 is divided into two, i.e., an upper case 41a and a lower case 41b. Both the upper case 41a and the lower case 41b are made of aluminum and are conductive. The upper case 41a is not shown in FIG. 2. Mainly a capacitor unit 60 (the filter capacitor 13), the smoothing capacitors 16, the reactor 14, and the IPM (not shown) are housed as a unit in the case 41. A circuit board unit that generates PWM signals for the switching circuits 23a and 23b described above, and a cooler that cools electronic components and the like are also housed in the case 41, but these are not shown.

The reactor 14 is formed by a core 15a, a coil 15b that is wound around the core 15a, and a resin 15c that covers the core 15a, as shown in FIG. 3. The core 15a is made of baked iron powder that is magnetic material. A lower side of the resin 15c is fixed to the lower case 41b. Although not shown, the resin 15c is more specifically fixed to the lower case 41b by a bolt.

The capacitor unit 60 is arranged so as to be adjacent to the reactor 14. The capacitor unit 60 is provided with the filter capacitor 13 therein, and is a device that has a metal plate 63 to protect the filter capacitor 13 from the heat of other components. The capacitor unit 60 is fixed by bolts 68 to base portions 41e that protrude from an inside wall of the lower case 41b in two locations. The capacitor unit 60 will be described in detail later. A shield 41c is provided standing upright from a bottom of the lower case 41b between the reactor 14 and the capacitor unit 60. The shield 41c prevents heat generated by the reactor 14 from being transferred directly to the filter capacitor 13 (the capacitor unit 60).

A reactor positive electrode bus bar 31 is connected to one, end 14a of the coil 15b of the reactor 14, and a reactor negative electrode bus bar 34 is connected to the other end 14b of the coil 15b. The reactor positive electrode bus bar 31 may also be referred to as a "reactor-side bus bar". Although not shown, the reactor negative electrode bus bar 34 is connected to the ground G. The bus bar is a metal bar-shaped member with little internal resistance, and refers to a conductive member for passing large current.

As is also evident from the block diagram in FIG. 1, the one end 14a of the reactor 14 is connected to the filter capacitor 13. In terms of hardware, as shown in FIGS. 2 and 3, the reactor positive electrode bus bar 31 that is connected 15 at the one end 14a of the reactor 14 is connected to a capacitor-side bus bar 32 that extends from the capacitor unit 60 (the filter capacitor 13) by a bolt 38. The other end of the capacitor-side bus bar 32 extends downward and is connected to a DC converter-side bus bar 35 by a bolt 39. Although not shown, a branch end extends from the middle of the capacitor-side bus bar 32, and this branch end is connected to one electrode of the filter capacitor 13 inside the capacitor unit 60. Also, the other electrode of the filter capacitor 13 is connected to the ground G. Although not shown, a bus bar that supplies power from the main battery 3 is also connected to a connecting position (the bolt 38) of the reactor positive electrode bus bar 31 and the capacitor-side bus bar 32.

Referring to FIG. 3, a heat-transfer member 36 is arranged above an uppermost horizontal portion 31a of the reactor positive electrode bus bar 31. This heat-transfer member 36 contacts the upper case 41a. That is, the reactor positive electrode bus bar 31 contacts the upper case 41a via the heat-transfer member 36. The heat-transfer member 36 is also insulating material. The heat-transfer member 36 is made of silicon, for example, and has excellent insulation properties and heat conductivity. Also, the heat-transfer member 36 has appropriate elasticity, such that when the upper case 41a is put on the lower case 41b, the heat-transfer member 36 contracts between the reactor positive electrode bus bar 31 and the upper case 41a, and closely contacts both the reactor positive electrode bus bar 31 and the upper case 41a.

Another circuit unit 55 is arranged above the capacitor unit 60. Although not shown, the circuit unit 55 is fixed to the upper case 41a. The circuit unit 55 houses a component that generates a large amount of heat. Therefore, a metal plate 63 is embedded in the capacitor unit 60 in order to protect the filter capacitor 13 from heat given off by the circuit unit 55. Next, the capacitor unit 60 will be described in detail.

The capacitor unit 60 includes a resin case 61, the metal plate 63 that is embedded in the case 61, a capacitor main body (the filter capacitor 13), and a filled resin 62 (filler) that is filled between the inside of the case 61 and the filter capacitor 13. The metal plate 63 is introduced to protect the capacitor main body from the heat of other devices. In the case of this example embodiment, the amount of heat generated by the circuit unit 55 positioned above the capacitor unit 60 is large, so the orientation of the capacitor unit 60 is determined such that the metal plate 63 is positioned above the capacitor main body. Further, the metal plate 63 is bent in a U-shape so as to surround the capacitor main body at the portion where the metal plate 63 is embedded, and moreover, the metal plate 63 extends outward from the sides of the case and is fixed by bolts 68 to the housing (i.e., the lower case 41b) of the PCU 5 outside of the case 61 of the capacitor unit 60, as shown in FIG. 4. Because the metal plate 63 that protects the capacitor main body (the filter capacitor 13) from heat of external components extends outside the case 61 and is fixed to the housing (i.e., the lower case 41b) of the PCU 5, heat from the outside that is absorbed by the metal plate 63 is diffused to the housing of the PCU 5. This structure helps to keep the capacitor main body from overheating. Heat absorbed by the metal plate 63 includes not only heat received from the outside, but also heat from the filter capacitor 13 itself. That is, the heat of the filter capacitor 13 can be diffused to the housing of the PCU 5 via the metal plate 63, which helps to keep the filter capacitor 13 from overheating. The entire metal plate 63 may be embedded in the case 61, or only a portion of the metal plate 63 may be embedded in the case 61. In the latter case, insulating material may be provided around the remaining portion of the metal plate 63 that is not embedded in the case 61.

A gap between the filter capacitor 13 and the case 61 is filled with the filled resin 62. The filled resin 62 is mainly used to protect the capacitor main body from impact and to insulate the capacitor main body from other components. The filled resin 62 is molten resin that has been poured into the gap around the capacitor main body after the capacitor main body has been arranged in the case 61, and hardened. The filled resin 62 that is resin that has been poured in and hardened differs from resin that has been hardened at a high pressure by an injection molding process, in that it is weaker than an injection molded product. The case 61 is made by injection molding, and is tougher than the filled resin 62. That is to say that the strength of case 61 is greater than that of the filler.

As described above, the metal plate 63 is embedded in the case 61 of the capacitor unit 60. Therefore, a portion of the case 61 exists between the metal plate 63 and the filter capacitor 13, as a shield wall 61a that separates the metal plate 63 from the filter capacitor 13. The area around the capacitor main body is filled with the filled resin 62, but the filled resin 62 is weak so cracking may occur if the thermal cycle of the capacitor main body or a thermal cycle applied from the outside is repeatedly applied excessively. However, the shield wall 61a that is a tougher injection molded product than the filled resin 62 is positioned between the capacitor main body and the metal plate 63. Therefore, with the capacitor unit 60, even if a crack occurs in the filled resin 62, the insulation between the capacitor main body and the metal plate 63 will not be break down. In other words, even if a crack occurs in the filled resin 62, the crack is inhibited from progressing by the high strength shield wall 61a, so a crack extending between the metal plate 63 and the filter capacitor 13 is able to be inhibited from forming, thus insulation between the metal plate 63 and the filter capacitor 13 is ensured. The shield wall 61a may typically be a portion of the case 61, as described in this example. When the case 61 and the shield wall 61a are both made of resin, a case and a partition wall may be integrally formed by injection molding.

Figure 5:
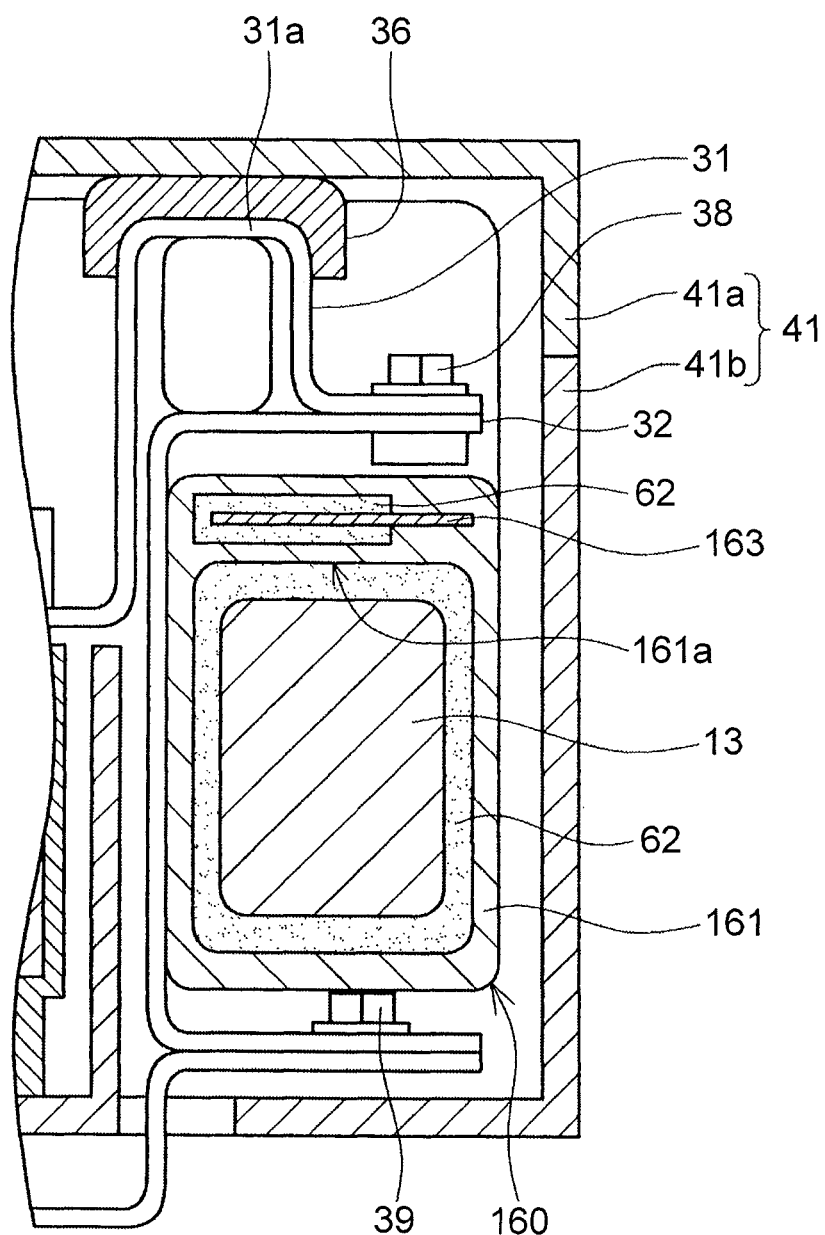
FIG. 5 is a sectional view of a power control unit according to a modified example.

Next, a modified example of the PCU 5 will be described. FIG. 5 is a partial sectional view of a PCU 5a according to the modified example. FIG. 5 corresponds to the sectional view of FIG. 3 of the PCU 5 described above. However, FIG. 5 is a partial enlarged view of the area around a capacitor unit 160. In the PCU 5a, the structure of the capacitor unit 160 differs from that of the capacitor unit 60 of the PCU 5 described above. The other structure is the same as that of the PCU 5. In the capacitor unit 160 of the PCU 5*a*, a space is provided around a portion of a metal plate 163, and this space is filled with the resin 62. In other words, with the capacitor unit 160, a portion of the metal plate 163 is embedded in a case 161, and the rest contacts the resin 62 in the space newly provided in a case 161. Also, a shield wall 161*a* (i.e., a partition wall) is provided with a portion of the case 161 extending between the capacitor main body (the filter capacitor 13) and the metal plate 163.

Now points to keep in mind regarding the technology described in the example embodiment will be described. The metal plate 63 provided in the capacitor unit 60 not only protects the capacitor main body (the filter capacitor 13) from heat given off by the circuit unit 55, but also protects the capacitor main body from heat generated by other components therearound. For example, the reactor positive electrode bus bar 31 extends above the capacitor unit 60 from the reactor 14, but the amount of heat generated by the reactor 14 is large, and this heat energy passes along the reactor positive electrode bus bar 31 and reaches the bolt 38 above the capacitor unit 60. The metal plate 63 that is embedded in the case 61 of the capacitor unit 60 also protects the capacitor main body from heat transferred from the reactor 14 via the reactor positive electrode bus bar 31.

The structure of the capacitor unit 60 described in the example embodiment is not limited to being applied to the filter capacitor 13. The technology described in this specification is also suitable for being applied to other capacitors, such as the smoothing capacitors 16 in FIG. 1, for example.

The shield wall 61*a* that is a portion of the case 61 of the capacitor unit 60 and is positioned between the metal plate 63 and the capacitor main body (the filter capacitor 13), corresponds to one example of a partition wall (a resin wall). The case 41 (i.e., the upper case 41*a* and the lower case 41*b*) of the PCU 5 corresponds to one example of a housing of the power converter.

While the invention has been described with reference to specific embodiments thereof, these example embodiments are for illustrative purposes only and are not intended to limit the scope of the claims for patent. Various modifications and variations of the specific examples described above are also included in the technology described in the scope of the claims for patent. The technical elements illustrated in the specification and the drawings display technical utility both alone and in various combinations. Further, the technology illustrated in the specification and the drawings simultaneously achieves a plurality of objects, and has technical utility by simply achieving one of these objects.

What is claimed is:

1. A power converter that is mounted in an electric vehicle and converts electric power of a battery to electric power suitable for driving a running motor, comprising:
   a capacitor;
   a case within which the capacitor is housed, the case including a metal plate and a partition wall, the metal plate positioning between the capacitor and another electronic component inside the power converter, and the partition wall separating the capacitor from the metal plate; and
   a filler interposed between the case and the capacitor, wherein:
      a displaced portion of the filler is spaced from the partition wall;
      a portion of the metal plate is embedded in the case; and
      a remaining portion of the metal plate that is not embedded in the case is provided in a space that contains the displaced portion of the filler.

2. The power converter according to claim 1, wherein the case and the partition wall are made of resin that is stronger than the filler.

3. The power converter according to claim 1, further comprising:
   a housing within which the case is housed,
   wherein the metal plate extends toward an outside of the case, and is fixed to the housing outside of the case.

4. The power converter according to claim 3, wherein the case and the partition wall are made of resin that is stronger than the filler.

5. The power converter according to claim 1, wherein the portion of the metal plate that is embedded in the case is aligned with a bolt positioned above the case.

* * * * *